United States Patent
Zeng et al.

(10) Patent No.: US 12,342,706 B2
(45) Date of Patent: Jun. 24, 2025

(54) DISPLAY PANEL AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Cheng Zeng, Beijing (CN); Jaeho Lee, Beijing (CN); Zhen Sun, Beijing (CN); Lulin Ma, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/780,304

(22) PCT Filed: Jun. 16, 2021

(86) PCT No.: PCT/CN2021/100430
§ 371 (c)(1),
(2) Date: May 26, 2022

(87) PCT Pub. No.: WO2022/261870
PCT Pub. Date: Dec. 22, 2022

(65) Prior Publication Data
US 2024/0164189 A1    May 16, 2024

(51) Int. Cl.
*H10K 59/80* (2023.01)
*H10K 50/856* (2023.01)
(Continued)

(52) U.S. Cl.
CPC .......... *H10K 59/80* (2023.02); *H10K 50/856* (2023.02); *H10K 50/858* (2023.02); *H10K 59/38* (2023.02);
(Continued)

(58) Field of Classification Search
CPC ................. H10K 50/856; H10K 59/38; H10K 59/80518; H10K 59/8731; H10K 59/878; H10K 59/879; H10K 59/8792
See application file for complete search history.

(56) References Cited

U.S. PATENT DOCUMENTS

2006/0181204 A1    8/2006  Zhu et al.
2012/0256202 A1*  10/2012  Lee .................. H10K 50/84
                                            257/E33.059
(Continued)

FOREIGN PATENT DOCUMENTS

CN    103728683 A    4/2014
CN    103904104 A    7/2014
(Continued)

*Primary Examiner* — Jaehwan Oh
(74) *Attorney, Agent, or Firm* — Nath, Goldberg & Meyer; Joshua B. Goldberg

(57) ABSTRACT

A display panel includes: a plurality of light-emitting devices on a substrate, wherein each light-emitting device is configured to emit light of a preset color; a color conversion layer including a plurality of light exiting parts, wherein each light exiting part corresponds to one light-emitting device, and the light exiting part is configured to receive light emitted by the corresponding light-emitting device and emit light of a color same as or different from the preset color; and an optical layer between the color conversion layer and the plurality of light-emitting devices, wherein the optical layer is configured to transmit at least a portion of the light of the preset color and reflect the light of a color different from the preset color emitted by the color conversion layer; wherein second electrodes corresponding to at (Continued)

least two light exiting parts, which emits light of different colors, have different reflectivities.

18 Claims, 10 Drawing Sheets

(51) Int. Cl.
*H10K 50/858* (2023.01)
*H10K 59/38* (2023.01)
*H10K 102/00* (2023.01)

(52) U.S. Cl.
CPC ......... *H10K 59/873* (2023.02); *H10K 59/878* (2023.02); *H10K 59/80518* (2023.02); *H10K 59/8731* (2023.02); *H10K 59/879* (2023.02); *H10K 59/8792* (2023.02); *H10K 2102/351* (2023.02)

(56) References Cited

U.S. PATENT DOCUMENTS

| 2014/0306869 | A1* | 10/2014 | Fujita | H10K 85/342 |
| | | | | 546/4 |
| 2018/0107069 | A1* | 4/2018 | Lee | G02F 1/133555 |
| 2020/0357853 | A1* | 11/2020 | Yan | H10K 50/858 |
| 2021/0159445 | A1* | 5/2021 | Sim | H10K 50/818 |
| 2021/0183301 | A1* | 6/2021 | Choi | G09G 3/32 |
| 2021/0234112 | A1* | 7/2021 | Seo | H10K 59/876 |
| 2022/0367434 | A1* | 11/2022 | Suh | C09K 11/77 |
| 2024/0147768 | A1* | 5/2024 | Han | H10K 59/8051 |

FOREIGN PATENT DOCUMENTS

| CN | 105529346 A | 4/2016 |
| CN | 111341928 A | 6/2020 |
| CN | 111653683 A | 9/2020 |
| CN | 111785768 A | 10/2020 |

* cited by examiner

DISPLAY PANEL AND DISPLAY APPARATUS

This is a National Phase Application filed under 35 U.S.C. 371 as a national stage of PCT/CN2021/100430, filed Jun. 16, 2021, the content of which is hereby incorporated by reference in its entirety.

TECHNICAL FIELD

The present disclosure relates to the field of display technology, and particularly to a display panel and a display apparatus.

BACKGROUND

A display architecture combining a quantum dot layer and an Organic Light-Emitting Diode (OLED) can realize a higher color gamut, a higher resolution and a larger viewing angle, and is suitable for a large-size self-luminous display technology.

SUMMARY

The present disclosure provides a display panel and a display apparatus.

In a first aspect, the present disclosure provides a display panel including:
- a plurality of light-emitting devices on a substrate, wherein each of the plurality of light-emitting devices is configured to emit light of a preset color; the light-emitting device includes a first electrode, a second electrode and a light-emitting functional layer, the first electrode and the second electrode are opposite to each other, the light-emitting functional layer is between the second electrode and the first electrode, and the first electrode is a reflective electrode;
- a color conversion layer including a plurality of light exiting parts, wherein each of the plurality of light exiting part corresponds to one of the plurality of light-emitting device, the light exiting part is on a side of the second electrode away from the light-emitting functional layer, and the light exiting part is configured to receive the light emitted by the corresponding light-emitting device and emit light of a color same as or different from the preset color; and
- an optical layer between the color conversion layer and the plurality of light-emitting devices, wherein the optical layer is configured to transmit at least a portion of the light of the preset color and reflect the light of a color different from the preset color emitted by the color conversion layer:
- wherein the second electrodes corresponding to at least two light exiting parts, which emit light of different colors, have different reflectivities.

In some embodiments, the plurality of light exiting parts of the color conversion layer include a red light exiting part for emitting red light, a green light exiting part for emitting green light and a blue light exiting part for emitting blue light; and
- a reflectivity of the second electrode corresponding to the red light exiting part and a reflectivity of the second electrode corresponding to the green light exiting part are both greater than a reflectivity of the second electrode corresponding to the blue light exiting part.

In some embodiments, the reflectivity of the second electrode corresponding to the red light exiting part is greater than the reflectivity of the second electrode corresponding to the green light exiting part.

In some embodiments, the reflectivity of the second electrode corresponding to the red light exiting part is in a range of 65% to 70%;
- the reflectivity of the second electrode corresponding to the green light exiting part is in a range of 60% to 70%; and
- the reflectivity of the second electrode corresponding to the blue light exiting part is in a range of 50% to 60%.

In some embodiments, a material of the second electrode of each of the plurality of light-emitting devices includes silver and magnesium, a thickness of the second electrode corresponding to the red light exiting part is in a range of 15 nm to 20 nm, a thickness of the second electrode corresponding to the green light exiting part is in a range of 12 nm to 20 nm, and a thickness of the second electrode corresponding to the blue light exiting part is in a range of 10 nm to 15 nm.

In some embodiments, the preset color is blue.

In some embodiments, the optical layer includes a plurality of first optical sub-layers and a plurality of second optical sub-layers, which are alternately stacked, and a refractivity of each of the plurality of first optical sub-layers is less than a refractivity of each of the plurality of second optical sub-layers.

In some embodiments, the refractivity of the first optical sub-layer is in a range of 1.45 to 1.50, and the refractivity of the second optical sub-layer is in a range of 1.85 to 1.95.

In some embodiments, a material of the first optical sub-layer includes an oxide of silicon, and a material of the second optical sub-layer including a nitride of silicon.

In some embodiments, the first optical sub-layer has a thickness in a range of 80 nm to 100 nm, and the second optical sub-layer has a thickness in a range of 700 nm to 800 nm.

In some embodiments, in the plurality of first optical sub-layers and the plurality of second optical sub-layers of the optical layer, one of the plurality of second optical sub-layers is closest to the color conversion layer.

In some embodiments, the optical layer includes at least four of the first optical sub-layers and at least five of the second optical sub-layers.

In some embodiments, the display panel further includes:
- a first encapsulation layer between the plurality of light-emitting devices and the optical layer; and
- a second encapsulation layer between the first encapsulation layer and the optical layer;
- wherein the first encapsulation layer is made of an inorganic material, and the second encapsulation layer is made of an organic material; the optical layer is directly adjacent to the second encapsulation layer, an orthographic projection of each of the plurality of first optical sub-layers and the plurality of second optical sub-layers on the substrate covers a orthographic projection of the plurality of light-emitting devices on the substrate, and the first encapsulation layer, the second encapsulation layer and the optical layer form an encapsulation structure to encapsulate the light-emitting devices.

In some embodiments, the second encapsulation layer is in contact with one of the plurality of second optical sub-layers of the optical layer, and a refractivity of the second encapsulation layer is less than a refractivity of the second optical sub-layer in contact with the second encapsulation layer.

In some embodiments, the second encapsulation layer has a refractivity in a range of 1.50 to 1.60.

In some embodiments, the display panel further includes:
- a light extraction layer between the second electrode of each of the plurality of light-emitting devices and the first encapsulation layer, and in contact with the second electrode; wherein the light extraction layer is configured to transmit the light emitted by the light-emitting device; and
- a protective layer between the first encapsulation layer and the light extraction layer.

In some embodiments, a material of at least a part of the plurality of light exiting parts includes a quantum dot material, and the display panel further includes a third encapsulation layer, which is on a side of the color conversion layer away from the optical layer.

In some embodiments, the display panel further includes:
- an accommodating structure layer on a side of the optical layer away from the light-emitting device, wherein the accommodating structure layer has a plurality of accommodating grooves, and the plurality of light exiting parts are arranged in the plurality of accommodating grooves in a one-to-one correspondence manner.

In some embodiments, the display panel further includes:
- a color filter layer on a side of the color conversion layer away from the optical layer, wherein the color filter layer includes a plurality of color filter parts, the plurality of color filter parts are in a one-to-one correspondence with the plurality of light exiting parts, and a color of each of the plurality of color filter parts is the same as the color of the light emitted by the corresponding light exiting part; and
- a black matrix on a side of the color conversion layer away from the light-emitting device, wherein an orthographic projection of at least a part of each of the plurality of light exiting parts on the substrate does not overlap an orthographic projection of the black matrix on the substrate.

In some embodiments, a minimum cross section of each of the plurality of color filters has a substantially same area as a minimum cross section of the corresponding light exiting part.

In some embodiments, the plurality of light exiting parts include a red light exiting part for emitting red light, a green light exiting part for emitting green light and a blue light exiting part for emitting blue light; and
- a ratio of an area of a minimum cross section of the red light exiting part to an area of a minimum cross section of the blue light exiting part and a ratio of an area of a minimum cross section of the green light exiting part to an area of a minimum cross section of the blue light exiting part are both in a range of 1:1 to 1.2:1.

In a second aspect, an embodiment of the present disclosure further provides a display apparatus, which includes the display panel described above.

BRIEF DESCRIPTION OF DRAWINGS

The accompanying drawings, which are included to provide a further understanding of the present disclosure and constitute a part of this specification, serve to explain the present disclosure together with the following specific embodiments, but do not constitute a limitation to the present disclosure. In the drawings.

DETAIL DESCRIPTION OF EMBODIMENTS

In order to make the objects, technical solutions and advantages of the embodiments of the present disclosure more apparent, the technical solutions of the embodiments of the present disclosure will be clearly and completely described with reference to the accompanying drawings of the embodiments of the present disclosure. Obviously, the described embodiments are only some of the embodiments of the present disclosure, not all of the embodiments. All other embodiments, which may be obtained by one of ordinary skill in the art without any creative effort based on the embodiments in the present disclosure, fall within the protection scope of the present disclosure.

The terminology used herein to describe embodiments of the present disclosure is not intended to limit and/or define the scope of the present disclosure. For example, unless otherwise defined, a technical or scientific term used herein shall have the ordinary meaning as understood by one of ordinary skill in the art to which the present disclosure belongs. It should be understood that the terms "first", "second", and the like, as used in the present disclosure, do not denote any order, quantity, or importance, but rather are used to distinguish one element from another. Unless the context clearly indicates otherwise, the term "a", "an", "the"

or the like does not denote a limitation of quantity, but rather denotes the presence of at least one. The term "comprising", "comprises", or the like, means that the element or item appearing in front of the word "comprising" or "comprises" includes the element or item listed after the word "comprising" or "comprises" and its equivalents, and does not exclude other elements or items. The term "connected", "coupled" or the like is not restricted to a physical or mechanical connection, but may include an electrical connection, whether direct or indirect. The terms "upper", "lower", "left", "right", and the like are used merely to indicate relative positional relationships, which may also change accordingly when the absolute position of the object being described changes.

In the following description, when an element or layer is referred to as being "on" or "connected to" another element or layer, it may be directly "on" or "connected to" another element or layer, or any intervening element or layer may be present. However, when an element or layer is referred to as being "directly on" or "directly connected to" another element or layer, there is no intervening element or layer present. The term "and/or" includes any and all combinations of one or more of the associated listed items.

Figure 1A:
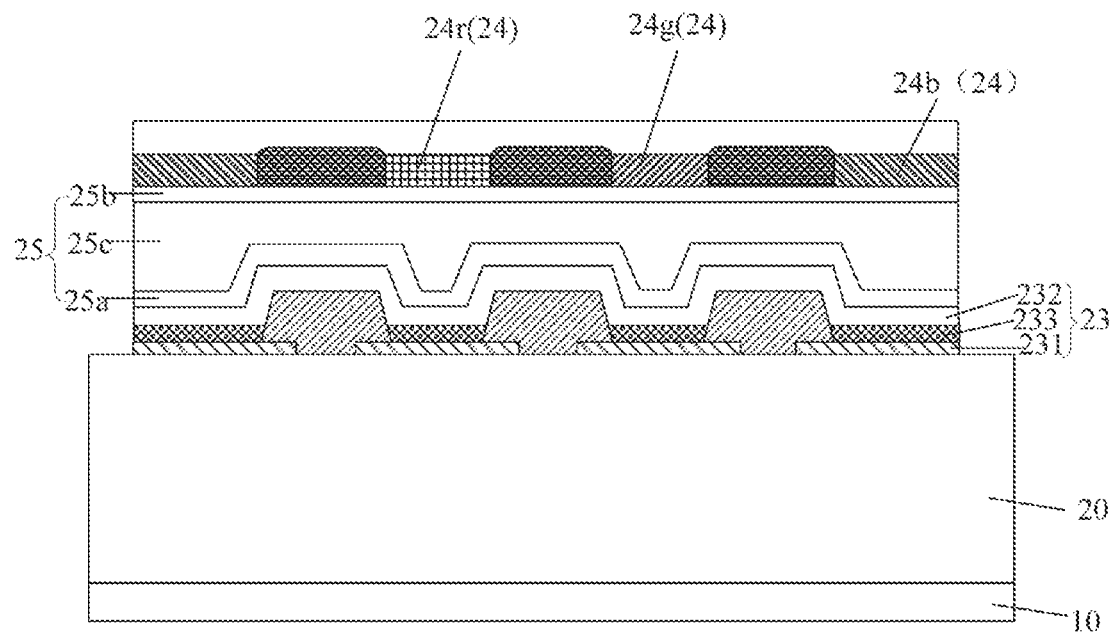
FIG. 1A is a schematic diagram of a display panel provided in a comparative example.

FIG. 1A is a schematic diagram of a display panel provided in a comparative example. As shown in FIG. 1A, the display panel includes a substrate 10, a driving structure layer 20 arranged on the substrate 10, a plurality of light-emitting devices 23 arranged on the driving structure layer 20, and an encapsulation structure 25 encapsulating the plurality of light-emitting devices 23. The driving structure layer 20 may include a pixel circuit for driving the light-emitting device 23 to emit light, the light-emitting device 23 may include a first electrode 231, a second electrode 232, and a light-emitting functional layer 233 between the first electrode 231 and the second electrode 232, the first electrode 231 may serve as an anode of the light-emitting device 23, and the second electrode 232 may serve as a cathode of the light-emitting device 23. The encapsulation structure 25 includes a first inorganic encapsulation layer 25a, a second inorganic encapsulation layer 25b, and an organic encapsulation layer 25c between the first inorganic encapsulation layer 25a and the second inorganic encapsulation layer 25b. In addition, the display panel further includes a plurality of light exiting parts 24, the light exiting parts 24 are arranged on a side of the encapsulation structure 25 away from the substrate 10, and the light exiting parts 24 may specifically include a red light exiting part 24r, a green light exiting part 24g, and a blue light exiting part 24b. The red light exiting part 24r and the green light exiting part 24g may be made of a quantum dot material, and the blue light exiting part 24b may be made of a scattering particle material. During displaying, the light-emitting device 23 emits blue light, the red light exiting part 24r emits red light under excitation of the blue light, the green light exiting part 24g emits green light under excitation of the blue light, and the blue light exiting part 24b transmits the blue light. Therefore, three primary colors of red, green and blue are generated.

Figure 1B:
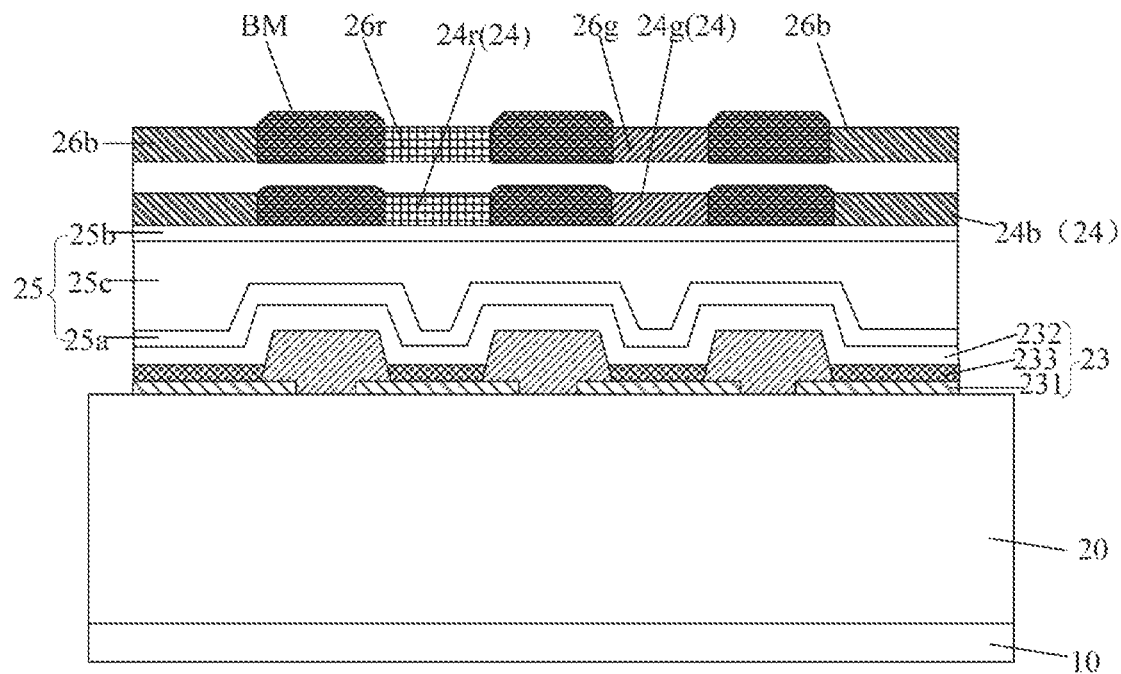
FIG. 1B is a schematic diagram of a display panel provided in another comparative example.

FIG. 1B is a schematic diagram of a display panel provided in another comparative example. Compared with the display panel in FIG. 1A, the display panel in FIG. 1B further includes a color filter layer located on a side of the plurality of light exiting parts 24 away from the substrate 10. The color filter layer includes a black matrix BM and a plurality of color filters including a red filter 26r, a green filter 26g, and a blue filter 26b.

Figure 2:
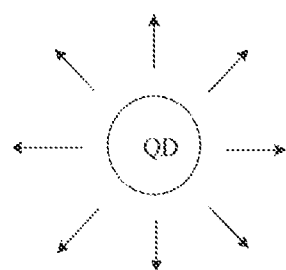
FIG. 2 is a schematic diagram of light emission of a quantum dot.

FIG. 2 is a schematic diagram of light emission of a quantum dot. As shown in FIG. 2, when the quantum dot QD is excited, light emitted by the quantum dot QD has isotropic characteristics, a portion of the light will be emitted to the light-exiting side of the display panel and thus seen by human eyes, and another portion of the light will be directed to the substrate 10 and may be totally reflected inside a film layer below the light exiting part 24 and cannot exit from the light-exiting side of the display panel, thereby reducing a front light extraction efficiency of the display panel.

Figure 3A:
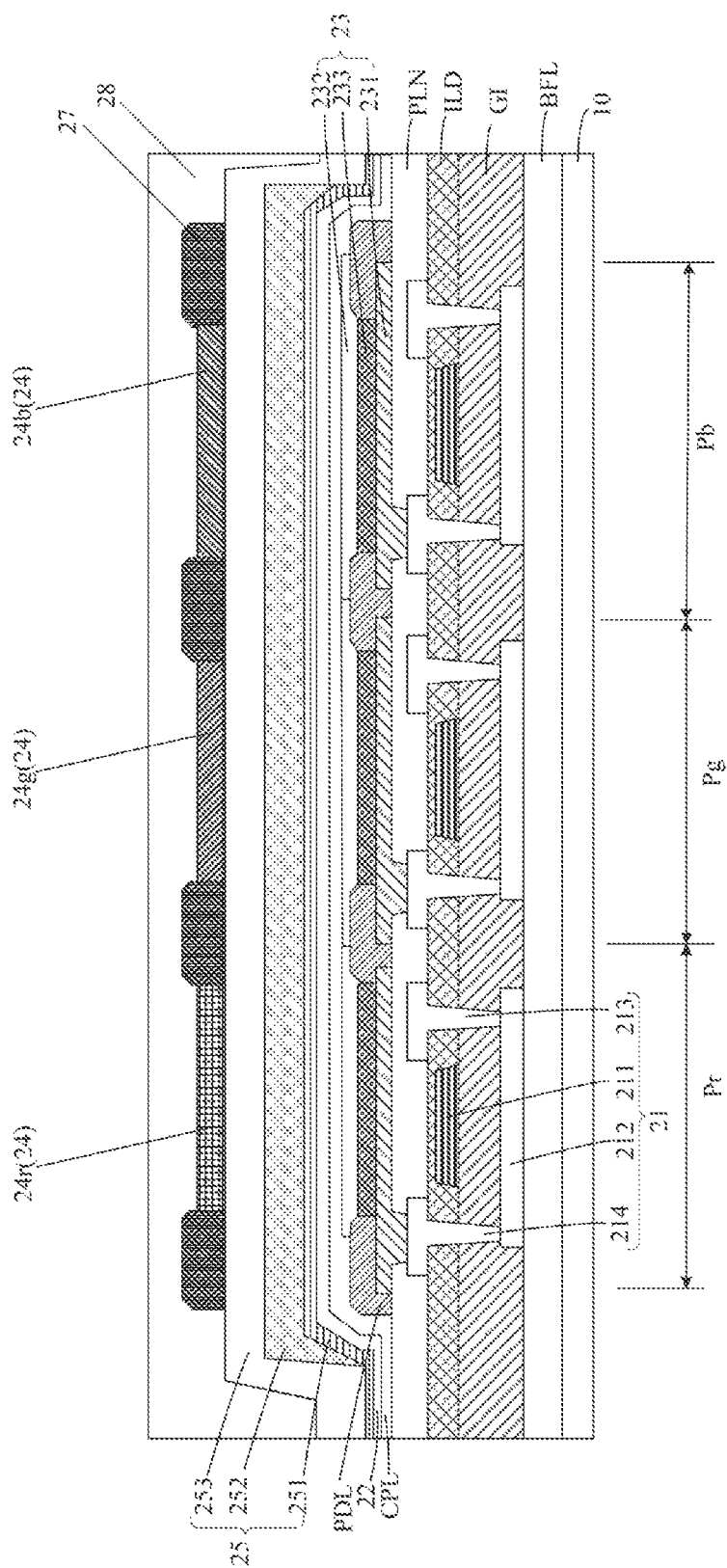
FIG. 3A is a schematic diagram of a display panel provided in some embodiments of the present disclosure.
Figure 3B:
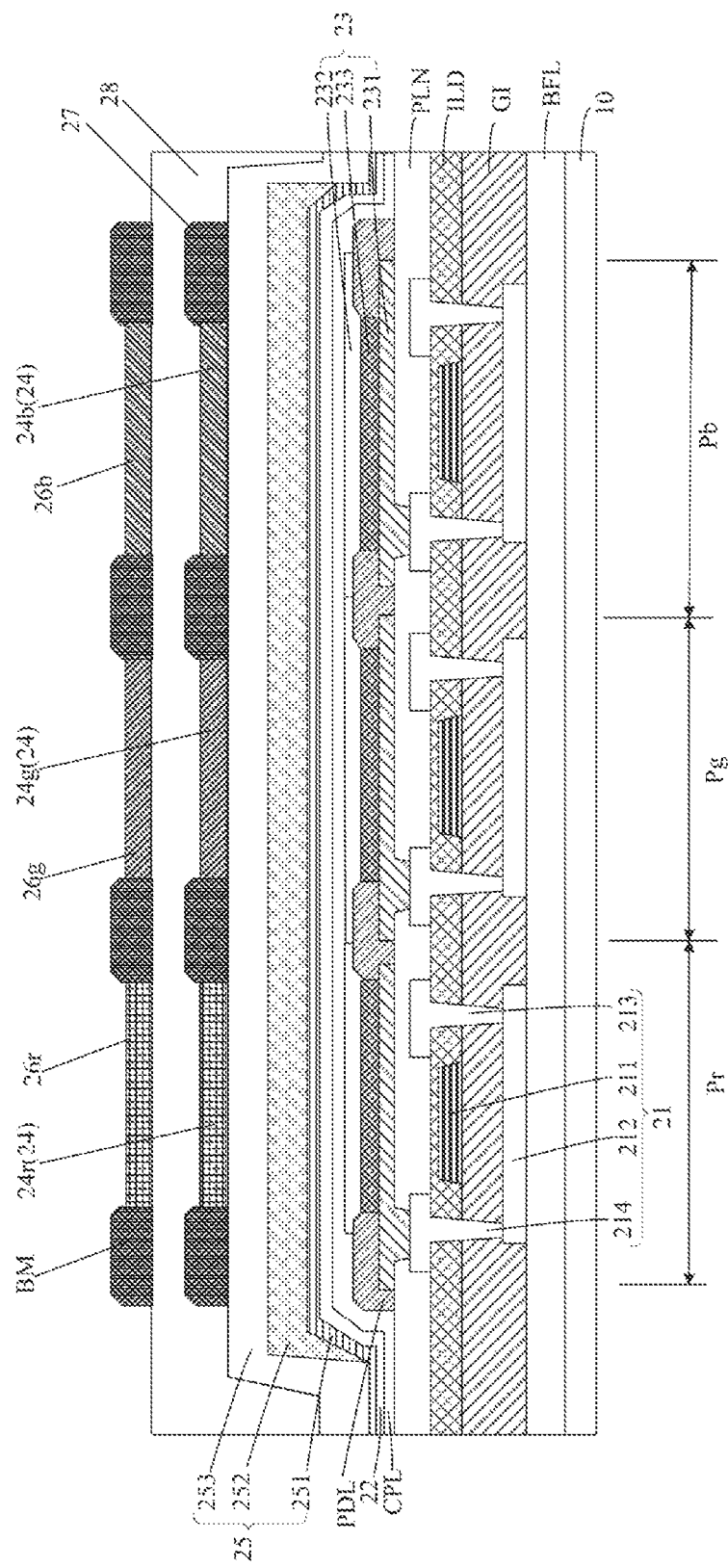
FIG. 3B is a schematic diagram of a display panel provided in other embodiments of the present disclosure.

FIG. 3A is a schematic diagram of a display panel provided in some embodiments of the present disclosure, and FIG. 3B is a schematic diagram of a display panel provided in other embodiments of the present disclosure. As shown in FIGS. 3A and 3B, the display panel has a plurality of sub-pixel regions, and the colors of the sub-pixel regions are divided into a plurality of colors, for example, the plurality of sub-pixel regions includes a red sub-pixel region Pr, a green sub-pixel region Pg, and a blue sub-pixel region Pb. The display panel may include a substrate 10, a plurality of light-emitting devices 23, a color conversion layer, and an optical layer 253.

The substrate 10 may be a glass substrate, or may be a flexible substrate made of a flexible material such as Polyimide (PI), so as to facilitate a realization of flexible display.

The light-emitting device 23 is arranged on the substrate 10 and configured to emit light of a preset color. The light-emitting device 23 includes a first electrode 231, a second electrode 232, and a light-emitting functional layer 233, the first electrode 231 and the second electrode 232 are oppositely arranged, and the light-emitting functional layer 233 is located between the second electrode 232 and the first electrode 231. The first electrode 231 may be an anode of the light-emitting device 23, the second electrode 232 may be a cathode of the light-emitting device 23, and the light-emitting functional layer 233 emits light when a current is generated between the first electrode 231 and the second electrode 232. The light-emitting functional layer 233 may include a hole injection layer, a hole transport layer, a light-emitting layer, an electron transport layer, and an electron injection layer, which are sequentially stacked. Alternatively, the light-emitting device 23 is an Organic Light-Emitting Diode (OLED) device, and in this case, the light-emitting layer is made of an organic light-emitting material. Alternatively, the light-emitting device 23 is a Quantum Dot Light-emitting Diode (QLED) device, and in this case, the light-emitting layer is made of a quantum dot light-emitting material. The first electrode 231 is a reflective electrode configured to reflect light irradiated to the first electrode 231; the second electrode 232 is configured to partially transmit and partially reflect light irradiated to the second electrode 232.

The color conversion layer includes a plurality of light exiting parts 24, each light exiting part 24 corresponds to one light-emitting device 23, and different light exiting parts 24 may correspond to different light-emitting devices 23, respectively. The light exiting part 24 is arranged on a light-exiting side of the corresponding light-emitting device 23 (i.e., a side of the second electrode 232 away from the light-emitting functional layer 233), and the light exiting part 24 is configured to receive light emitted by the corresponding light-emitting device 23 and emit light of a color same as or different from the preset color. For example, the preset color is blue, and a color of the light emitted by the light exiting part 24 may be red, green or blue. Each sub-pixel region is provided with a light-emitting device 23 and a light exiting part 24, and a color emitted by the light exiting part 24 is a color of the sub-pixel region. In some embodiments, the color conversion layer includes a quantum dot material.

In some embodiments, the second electrodes 232 corresponding to at least two light exiting parts 24, which emit light of different colors, have different reflectivities. A second electrode 232 corresponding to any one of the light exiting parts 24 is a second electrode 232 located in a same sub-pixel region as this light exiting part 24. For example, the plurality of light exiting parts 24 constitute a plurality of repeating units, each of the plurality of repeating units includes a red light exiting part 24r for emitting red light, a green light exiting part 24g for emitting green light, and a blue light exiting part 24b for emitting blue light. The second electrode 232 corresponding to the red light exiting part 24r and the second electrode 232 corresponding to the blue light exiting part 24b have different reflectivities; the second electrode 232 corresponding to the green light exiting part 24g and the second electrode 232 corresponding to the blue light exiting part 24b have different reflectivities.

The optical layer 253 is arranged between the color conversion layer and the plurality of light-emitting devices 23, and the optical layer 253 is configured to transmit at least a portion of the light of the preset color and reflect light emitted by the color conversion layer, which has a color different from the preset color. For example, when light of the preset color is irradiated to the optical layer 253, the optical layer 253 may partially transmit and partially reflect the light of the preset color; when light of a color different from the preset color emitted by the color conversion layer is irradiated to the optical layer 253, the optical layer 253 totally reflects or substantially totally reflects the light of the color different from the preset color.

In the embodiment of the present disclosure, since the optical layer 253 may reflect the light of the color different from the preset color emitted by the color conversion layer, when the light of the color different from the preset color emitted by the color conversion layer exits toward the optical layer 253, the optical layer 253 reflects at least a portion of the light to the light-exiting side of the display panel, thereby improving the light extraction efficiency of the display panel. When some light passes through the optical layer 253 and irradiates the second electrode 232, the light may be reflected by the second electrode 232, so that the light extraction efficiency of the display panel is further improved. Moreover, the reflectivities of the second electrodes 232 in the plurality of sub-pixel regions are not completely the same, which is beneficial to adjusting the light extraction efficiency of the sub-pixel regions of different colors, so that the sub-pixel regions of various colors all achieve a higher light extraction efficiency.

The following specifically describes the display panel provided in the embodiment of the present disclosure referring to the drawings and taking an example that the color conversion layer includes a red light exiting part 24r, a green light exiting part 24g, and a blue light exiting part 24b. The light-emitting device 23 emits blue light, the red light exiting part 24r emits red light after being excited by the blue light, the green light exiting part 24g emits green light after being excited by the blue light, and the blue light exiting part 24b transmits the blue light. A material of the red light exiting part 24r includes a red quantum dot material, a material of the green light exiting part 24g includes a green quantum dot material, and a material of the blue light exiting part 24b includes a scattering particle material. The quantum dot material may be one or more of ZnCdSe2, CdSe, CdTe. InP and InAs; without being limited to the above materials, the quantum dots may be selected from group II-VI compounds, group II-V compounds, group IV-VI compounds, group IV elements, group IV compounds, and/or combinations thereof.

As shown in FIGS. 3A and 3B, the display panel includes a driving structure layer arranged on the substrate 10, and the driving structure layer includes a plurality of pixel driving circuits, the pixel driving circuits are in a one-to-one correspondence with the light-emitting devices 23, and each of the pixel driving circuits is configured to provide a driving current for the light-emitting device 23 to drive the light-emitting device 23 to emit light. For example, the pixel drive circuit includes a plurality of thin film transistors 21. The thin film transistor 21 includes a gate electrode 211, an active layer 212, a source electrode 213 and a drain electrode 214. Taking a top gate thin film transistor as an example of the thin film transistor 21, the active layer 212 is located between the gate electrode 211 and the substrate 10. A material of the active layer 212 may include, for example, an inorganic semiconductor material (e.g., poly-silicon, amorphous silicon, etc.), an organic semiconductor material, or an oxide semiconductor material. The active layer 212 includes a channel part, and a source connecting part and a drain connecting part on both sides of the channel part, the source connecting part is connected to the source electrode 213 of the thin film transistor 21, and the drain connecting part is connected to the drain electrode 214 of the thin film transistor 21. Each of the source connecting part and the drain connecting part may be doped with an impurity (e.g., an N-type impurity or a P-type impurity) having a higher impurity concentration than the channel part. The channel part is directly opposite to the gate electrode 211 of the thin film transistor 21. When a voltage signal applied to the gate electrode 211 reaches a certain value, a carrier path is formed in the channel part, so that the source electrode 213 and the drain electrode 214 of the thin film transistor 21 are in conduction.

As shown in FIGS. 3A and 3B, a buffer layer BFL is arranged between the thin film transistor 21 and the substrate 10 for preventing or reducing diffusion of metal atoms and/or impurities from the substrate 10 into the active layer 212 of the thin film transistor 21. The buffer layer BFL may include an inorganic material such as silicon oxide, silicon nitride, and/or silicon oxynitride, and may be formed as a multi-layer or a single layer.

As shown in FIGS. 3A and 3B, a gate insulating layer GI is arranged on a side of the active layer 212 away from the buffer layer BFL. A material of the gate insulating layer GI may include a silicon compound of a metal oxide. For example, the material of the gate insulating layer GI includes silicon oxynitride, silicon oxide, silicon nitride, silicon oxycarbide, silicon carbonitride, aluminum oxide, aluminum nitride, tantalum oxide, hafnium oxide, zirconium oxide, titanium oxide, or the like. In addition, the gate insulating layer GI may be a single layer or a multi-layer.

As shown in FIGS. 3A and 3B, the gate electrode 211 of the thin film transistor 21 is arranged on a side of the gate insulating layer GI away from the buffer layer BFL. A material of the gate electrode 211 may include, for example, a metal alloy, a metal nitride, a conductive metal oxide, a transparent conductive material, or the like. For example, the gate electrode 211 may include gold, an alloy of gold, silver, an alloy of silver, aluminum, an alloy of aluminum, aluminum nitride, tungsten, tungsten nitride, copper, an alloy of copper, nickel, chromium, chromium nitride, molybdenum, an alloy of molybdenum, titanium, titanium nitride, platinum, tantalum, tantalum nitride, neodymium, scandium, strontium ruthenium oxide, zinc oxide, tin oxide, indium oxide, gallium oxide, indium tin oxide, indium zinc oxide, or the like. The gate electrode 211 may be a single layer or a multi-layer.

As shown in FIGS. 3A and 3B, an interlayer insulating layer ILD is arranged on a side of the gate electrode 211 away from the buffer layer BFL, a material of the interlayer insulating layer ILD may include, for example, a silicon compound, a metal oxide, etc. In particular, the silicon compounds and metal oxides listed above may be selected and will not be repeated here.

A source/drain conductive layer is arranged on a side of the interlayer insulating layer ILD away from the buffer layer BFL. The source/drain conductive layer may include a source electrode 213 and a drain electrode 214 of a respective transistor, the source electrode 213 is electrically connected to the source connecting part, and the drain electrode 214 is electrically connected to the drain connecting part. The source/drain conductive layer may include a metal, an alloy, a metal nitride, a conductive metal oxide, a transparent conductive material, or the like, for example, the source/drain conductive layer may be made of a single layer of metal or a plurality of layers of metals, such as Mo/Al/Mo or Ti/Al/Ti.

As shown in FIGS. 3A and 3B, a planarization layer PLN is arranged on a side of the source/drain conductive layer away from the buffer layer BFL, and the planarization layer PLN may be made of an organic insulating material, for example, the organic insulating material may include a resin material such as polyimide, epoxy, acryl, polyester, photoresist, polyacrylate, polyamide, siloxane, or the like.

As shown in FIGS. 3A and 3B, a pixel defining layer PDL is located on a side of the planarization layer PLN away from the buffer layer BFL, the pixel defining layer PDL has a plurality of pixel openings. The light-emitting devices 23 are in a one-to-one correspondence with the pixel openings. The light-emitting device 23 includes a first electrode 231, a second electrode 232, and a light-emitting functional layer 233 between the first electrode 231 and the second electrode 232. For example, the first electrode 231 is an anode, and the second electrode 232 is a cathode. The first electrode 231 is located between the pixel defining layer PDL and the planarization layer PLN, and a portion of the first electrode 231 is exposed from the pixel opening.

Alternatively, the first electrode 231 is a single metal layer, for example, a material of the metal layer includes silver (Ag), or may alternatively include a metal such as magnesium (Mg), aluminum (Al), platinum (Pt), gold (Au), nickel (Ni), and neodymium (Nd). Alternatively, the first electrode 231 includes a plurality of conductive film layers stacked together. For example, the plurality of conductive film layers may include an indium tin oxide (ITO) layer and a silver (Ag) layer which are stacked in a direction away from the substrate 10. Alternatively, the plurality of conductive film layers may include an Ag layer and an ITO layer which are stacked in a direction away from the substrate 10. Alternatively, the plurality of conductive film layers may include an ITO layer and an Mg layer which are stacked in a direction away from the substrate 10. Alternatively, the plurality of conductive film layers may include an ITO layer, an Ag layer, and an ITO layer, which are stacked in a direction away from the substrate 10. The second electrode 232 is a metal layer with a small thickness, for example, a material of the second electrode 232 includes one or more of silver (Ag), magnesium (Mg), copper (Cu), aluminum (Al), platinum (Pt), palladium (Pd), gold (Au), nickel (Ni), neodymium (Nd), iridium (Ir), and calcium (Ca).

The scattering particles in the blue light exiting part 24b emit less light toward the substrate 10 than the quantum dot material in the red light exiting part 24r and the green light exiting part 24g. Therefore, the second electrodes 232 corresponding to the red light exiting parts 24r and the green light exiting parts 24g require higher reflection power than the second electrodes 232 corresponding to the blue light exiting parts 24b. Therefore, in some embodiments, the reflectivity of the second electrode 232 corresponding to the red light exiting part 24r and the reflectivity of the second electrode 232 corresponding to the green light exiting part 24g are both greater than the reflectivity of the second electrode 232 corresponding to the blue light exiting part 24b. In this case, when the red light emitted by the red light exiting part 24r is irradiated to the second electrode 232 and the green light emitted by the green light exiting part 24g is irradiated to the second electrode 232, the second electrodes 232 may reflect the received red light and green light, thereby improving the front light extraction efficiency of the red light exiting part 24r and the green light exiting part 24g.

Furthermore, the reflectivity of the second electrode 232 corresponding to the green light exiting part 24g may be less than the reflectivity of the second electrode 232 corresponding to the red light exiting part 24r and greater than the reflectivity of the second electrode 232 corresponding to the blue light exiting part 24b, so as to further improve the front light extraction efficiency of the red light exiting part 24r and the green light exiting part 24g.

Figure 4A:
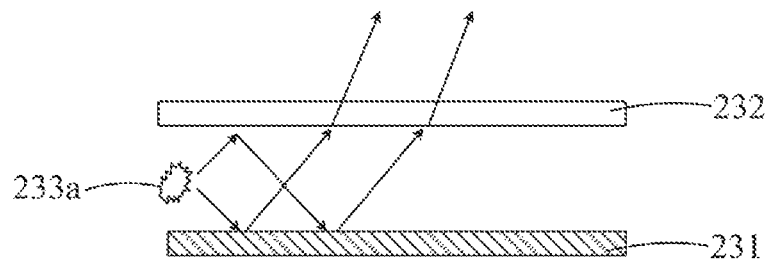
FIG. 4A is a schematic diagram of an optical path in a light-emitting device.
Figure 4B:
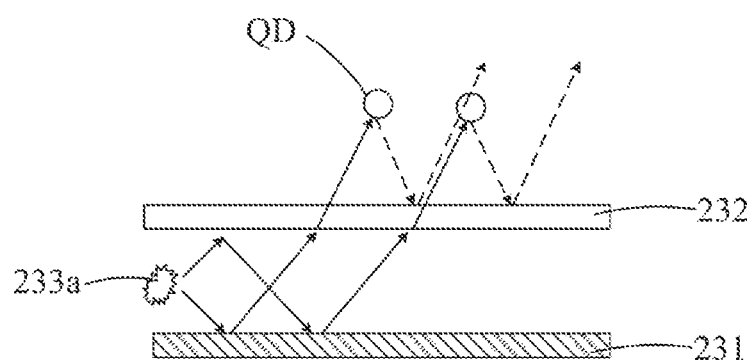
FIG. 4B is a schematic diagram of an optical path between a light-emitting device and quantum dots.

FIG. 4A is a schematic diagram of an optical path in a light-emitting device, and FIG. 4B is a schematic diagram of an optical path between a light-emitting device and quantum dots. As shown in FIGS. 4A and 4B, in the light-emitting device 23, a resonant cavity exists between the first electrode 231 and the second electrode 232, which has a micro-cavity effect on light emitted by the light-emitting device 23, that is, light emitted by the light-emitting material 233a at a specific angle is reflected between the first electrode 231 and the second electrode 232 multiple times, so that a strong interference effect is generated, and an intensity of the light at the specific angle is enhanced. The quantum dots QD emit light when excited, and the second electrode 232 reflects at least a portion of the light when the light emitted by the quantum dots is directed to the second electrode 232. For the blue light exiting part 24b, when the reflectivity of the second electrode 232 corresponding to the blue light exiting part 24b is too low, the micro-cavity effect of the light-emitting device 23 is weak, so that the front light extraction efficiency of the blue light exiting part 24b is low; when the reflectivity of the second electrode 232 corresponding to the blue light exiting part 24b is too high, an amount of blue light transmitted by the second electrode 232 is too small, which also results in a lower front light extraction efficiency of the blue light exiting part 24b. Similarly, for the red light exiting parts 24r and the green light exiting parts 24g, when the reflectivities of the second electrodes 232 corresponding to the red light exiting part 24r and the green light exiting part 24g are too low, the micro-cavity effect of the light-emitting devices 23 is weak, so that the front light extraction efficiencies of the red light exiting part 24r and the green light exiting pars 24g are weak, in addition, when the red light emitted by the red light exiting part 24r and the green light emitted by the green light exiting part 24g irradiate on the respective second electrodes 232, the second electrodes 232 have a weak reflection effect on the red light and the green light, respectively, and the light-emitting efficiencies of the red light exiting part 24r and the light-emitting efficiency of the green light exiting part 24g are also affected; when the reflectivities of the second electrode 232 corresponding to the red light exiting part 24r and the green light exiting part 24g are too high, although the micro-cavity effect of the light-emitting device 23 is strong and the reflection effect of the second electrodes 232 on the red light and the green light is also strong, the amount of the blue light transmitted by the second electrode 232 is small, and the front light extraction efficiencies of the red light exiting part 24r and the green light exiting part 24g are still low.

In order to enable the light-emitting device 23 to have a stronger micro-cavity effect, and to enable the second electrode 232 to transmit more blue light and have a stronger reflection effect on light of the corresponding light exiting part 24, in a preferred embodiment of the present disclosure, the reflectivity of the second electrode 232 corresponding to the red light exiting part 24r is in a range of 65% to 70%, the reflectivity of the second electrode 232 corresponding to the green light exiting part 24g is in a range of 60% to 70%, and the reflectivity of the second electrode 232 corresponding to the blue light exiting part 24b is in a range of 50% to 60%, so that the front light extraction efficiency of the respective light exiting part is improved. For example, the reflectivity of the second electrode 232 corresponding to the red light exiting part 24r is in a range of 65% to 67%, the reflectivity of the second electrode 232 corresponding to the green light exiting part 24g is in a range of 60% to 63%, and the reflectivity of the second electrode 232 corresponding to the blue light exiting part 24b is in a range of 50% to 52%; for example, the reflectivity of the second electrode 232 corresponding to the red light exiting part 24r is in a range of 67% to 68%, the reflectivity of the second electrode 232 corresponding to the green light exiting part 24g is in a range of 65% to 66%, and the reflectivity of the second electrode 232 corresponding to the blue light exiting part 24b is in a range of 54% to 55%; for example, the reflectivity of the second electrode 232 corresponding to the red light exiting part 24r is in a range of 68% to 69%, the reflectivity of the second electrode 232 corresponding to the green light exiting part 24g is in a range of 66% to 67%, and the reflectivity of the second electrode 232 corresponding to the blue light exiting part 24b is in a range of 55% to 57%. Here, the "reflectivity of the second electrode 232" in the embodiments of the present disclosure means a reflectivity of the second electrode 232 with respect to light having a wavelength of 550 nm.

The reflectivity of the second electrode 232 corresponding to the respective light exiting part 24 is related to a material and a thickness. In some embodiments, for convenience of manufacturing, all the second electrodes 232 may be made of a same material, and the reflectivity of the second electrodes 232 is adjusted to the above range by adjusting the thicknesses of the second electrodes 232. In some examples, the material of each second electrode 232 includes Ag and Mg, wherein a volume ratio of Ag to Mg is in a range of 11:1 to 7:3, for example, the volume ratio of Ag to Mg may be 9:1, the thickness of the second electrode 232 corresponding to the red light exiting part 24r is in a range of 15 nm to 20 nm, the thickness of the second electrode 232 corresponding to the green light exiting part 24g is in a range of 12 nm to 20 nm, and the thickness of the second electrode 232 corresponding to the blue light exiting part 24b is in a range of 10 nm to 15 nm.

For example, the thickness of the second electrode 232 corresponding to the red light exiting part 24r is 20 nm, the thickness of the second electrode 232 corresponding to the green light exiting part 24g is 15 nm, and the thickness of the second electrode 232 corresponding to the blue light exiting part 24b is 10 nm. In this case, when the respective second electrode 232 is formed, an electrode having a thickness of 10 nm may be formed on the light-emitting functional layer 233 in each sub-pixel region; then, an electrode having a thickness of 5 nm is formed in the green sub-pixel region, thereby forming an electrode having a thickness of 15 nm in the green sub-pixel region; finally, an electrode having a thickness of 10 nm is formed in the red sub-pixel region, thereby forming an electrode having a thickness of 20 nm in the red sub-pixel region. Each time an electrode is formed, an evaporation process may be used.

As shown in FIGS. 3A and 3B, a light extraction layer CPL is arranged on a side of the plurality of light-emitting devices 23 away from the substrate 10, and the light extraction layer CPL is configured to transmit light emitted by the light-emitting devices 23. The light extraction layer CPL may be made of a material with a relatively large refractivity, so that the light emitted by the light-emitting device 23 to an interface between the second electrode 232 and the light extraction layer CPL may be directed to the light exiting part 24 as much as possible. Alternatively, the refractivity of the light extraction layer CPL is in a range of 1.75 to 1.9, for example, the refractivity of the light extraction layer CPL is 1.85. The light extraction layer CPL may be made of an organic material.

The first encapsulation layer 251 covers the plurality of light-emitting devices 23 to prevent the light-emitting devices 23 from being corroded by moisture and/or oxygen in the external environment. The first encapsulation layer 251 may be made of an inorganic material with high compactness, such as silicon oxynitride, silicon oxide, or silicon nitride, for example, the first encapsulation layer 251 is made of silicon nitride.

The first encapsulation layer 251 may be formed by a Plasma Enhanced Chemical Vapor Deposition (PECVD) process. In order to prevent the plasma process of fabricating the first encapsulation layer 251 from affecting the light-emitting devices 23, a protective layer 22 may be arranged between the first encapsulation layer 251 and the plurality of light-emitting devices 23, and the protective layer 22 may be arranged between the first encapsulation layer 251 and the light extraction layer CPL. A material of the protective layer 22 may include lithium fluoride (Lif).

The second encapsulation layer 252 is arranged on a side of the first encapsulation layer 251 away from the light-emitting devices 23, and the optical layer 253 is arranged on a side of the second encapsulation layer 252 away from the first encapsulation layer 251 and directly adjacent to the second encapsulation layer 252, i.e., no other layers are arranged between the optical layer 253 and the second encapsulation layer 252. In some embodiments, an orthographic projection of the optical layer 253 on the substrate 10 covers an orthographic projection of all the light-emitting devices 23 on the substrate 10. The optical layer 253 is arranged on a remote surface of the second encapsulation layer 252, and the first encapsulation layer 251, the second encapsulation layer 252 and the optical layer 253 form an encapsulation structure 25 to encapsulate the plurality of light-emitting devices 23, so as to prevent moisture and/or oxygen in the external environment from corroding the light-emitting devices 23. The first encapsulation layer 251 and the optical layer 253 may be made of an inorganic material with high compactness, the second encapsulation layer 252 may be made of an organic polymer resin material, such as methyl methacrylate (PMMA), the second encapsulation layer 252 may relieve stress between the first encapsulation layer 251 and the optical layer 253, and the second encapsulation layer 252 may further include a water-absorbing material such as a drying agent to absorb water molecules and/or oxygen molecules that enter the second encapsulation layer 252. The second encapsulation layer 252 may be formed through an inkjet printing process.

In order to improve the water and oxygen isolation effect of the encapsulation structure, the first encapsulation layer 251 is in contact with an edge of the optical layer 253, and an orthographic projection of the second encapsulation layer 252 on the substrate 10 covers an orthographic projection of the plurality of light-emitting devices 23 on the substrate 10.

Figure 5:
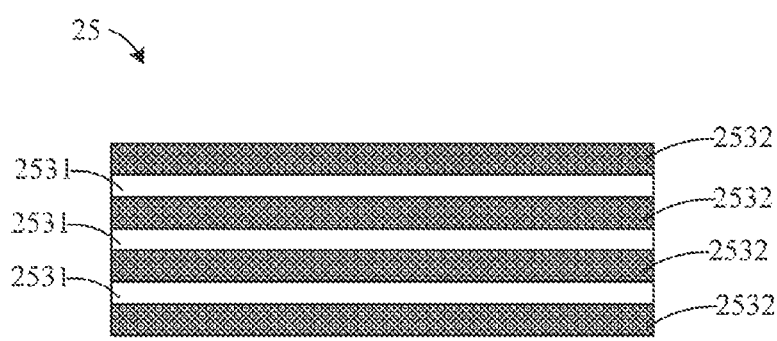
FIG. 5 is a schematic diagram of a structure of an optical layer provided in some embodiments of the present disclosure.
Figure 6:
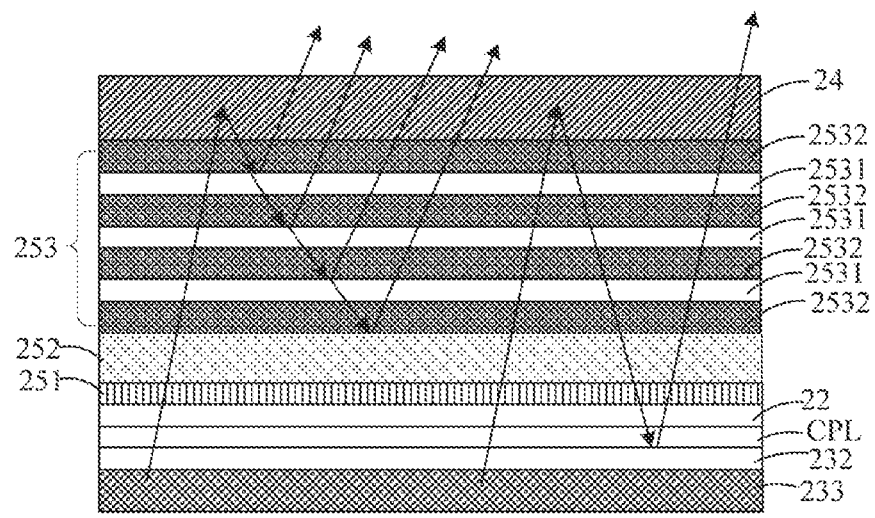
FIG. 6 is a diagram of optical paths of light emitted by an light exiting part.

FIG. 5 is a schematic diagram of a structure of an optical layer provided in some embodiments of the present disclosure, FIG. 6 is a diagram of an optical path of light emitted by an light exiting part, and each of the optical layers of the display panels in FIGS. 3A and 3B may adopt the structure shown in FIG. 5. As shown in FIGS. 5 and 6, in some embodiments, the optical layer 253 includes a plurality of first optical sub-layers 2531 and a plurality of second optical sub-layers 2532, which are alternately stacked, and a refractivity of each of the first optical sub-layers 2531 is less than that of each of the second optical sub-layers 2532. Thus, the light emitted by the light-emitting functional layer 233 irradiates on the light exiting part 24, so as to excite the light exiting part 24 to emit light, and when the light emitted by the light exiting part 24 passes through the second optical sub-layer 2532 and is directed to an interface between the second optical sub-layer 2532 and the first optical sub-layer 2531, at least a portion of the light is totally reflected; even if a portion of the light emitted by the light exiting part 24 is not reflected by the optical layer 253, the portion of the light is reflected by the second electrode 232, so that the front light extraction efficiency of the light exiting part 24 is improved.

In some embodiments, as shown in FIG. 5, the optical layer 253 includes at least four first optical sub-layers 2531 and at least five second optical sub-layers 2532, e.g., the optical layer 253 may include four first optical sub-layers 2531 and five second optical sub-layers 2532; for another example, the optical layer 253 includes five first optical sub-layers 2531 and six second optical sub-layers 2532; for another example, the optical layer 253 includes six first optical sub-layers 2531 and seven second optical sub-layers 2532. Among the plurality of first optical sub-layers 2531 and the plurality of second optical sub-layers 2532 of the optical layer 253, one closest to the color conversion layer and one closest to the second encapsulation layer 252 are both the second optical sub-layers 2532, the second encapsulation layer 252 is in contact with the second optical sub-layer 2532, and a refractivity of the second optical sub-layer 2532 in contact with the second encapsulation layer 252 may be greater than that of the second encapsulation layer 252, so that the red light and the green light emitted by the color conversion layer to the optical layer 253 are reflected to the light-exiting side of the display panel as much as possible.

In some embodiments, a refractivity of the first optical sub-layer 2531 is in a range of 1.45 and 1.50, and a refractivity of the second optical sub-layer 2532 is in a range of 1.85 and 1.95, in which case the red light and the green light emitted by the color conversion layer to the optical layer 253 may be reflected to a greater extent to the light-exiting side of the display panel.

In some examples, a material of the first encapsulation layer 251 includes silicon oxynitride having a refractivity in a range of 1.70 to 1.75. The second encapsulation layer 252 is made of methyl methacrylate having a refractivity in a range of 1.50 to 1.60 and a film thickness in a range of 8 μm to 12 μm. A material of each second optical sub-layer 2532 in the optical layer 253 is silicon nitride, and a material of each first optical sub-layer 2531 is silicon oxide. The first optical sub-layer 2531 and the second optical sub-layer 2532 are formed through a PECVD process.

In some embodiments, a thickness of each of the second optical sub-layers 2532 is in a range of 700 nm to 800 nm, and a thickness of each of the first optical sub-layers 2531 is in a range of 80 nm to 100 nm, so that an overall thickness of the display panel is prevented from being large while the front light extraction efficiency of the display panel is ensured. The second optical sub-layers 2532 in the optical layer 253 may each have a same refractivity and a same thickness, or may alternatively have different refractivities and different thicknesses, respectively; the first optical sub-layers 2531 in the optical layer 253 may each have a same refractivity and a same thickness, or may alternatively have different refractivities and different thicknesses, respectively. In one example, the first optical sub-layers 2531 each have a refractivity of 1.45 or 1.50, and a film thickness of 80 nm, 90 nm or 100 nm; the second optical sub-layers 2532 each have a refractivity of 1.85, 1.90 or 1.95, and a film thickness of 800 nm, 750 nm or 700 nm.

As shown in FIGS. 3A and 3B, the color conversion layer and an accommodating structure layer 27 are both arranged on the side of the optical layer 253 away from the substrate 10. The accommodating structure layer 27 has a plurality of accommodating grooves, which are in a one-to-one correspondence with the light exiting parts 24, and the light exiting parts 24 are arranged in the accommodating grooves, respectively. A material of the accommodating structure layer 27 may include acrylic polymer photo-initiator, organic pigment, resin organic material, or a mixture thereof, wherein the organic pigment may be black to make the accommodating structure layer 27 have a light shielding function and prevent crosstalk occurring between different light exiting parts.

Figure 7A:
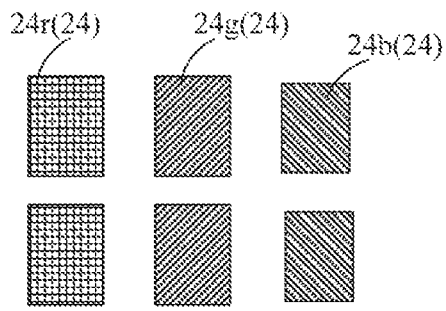
FIG. 7A is a schematic diagram illustrating how to arrange light exiting parts and light-emitting functional layers provided in some embodiments of the present disclosure.
Figure 7A:
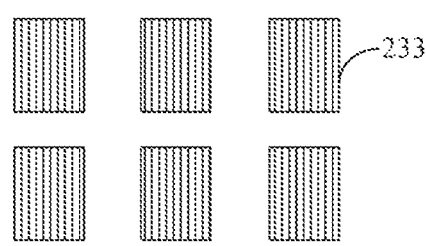
Figure 7B:
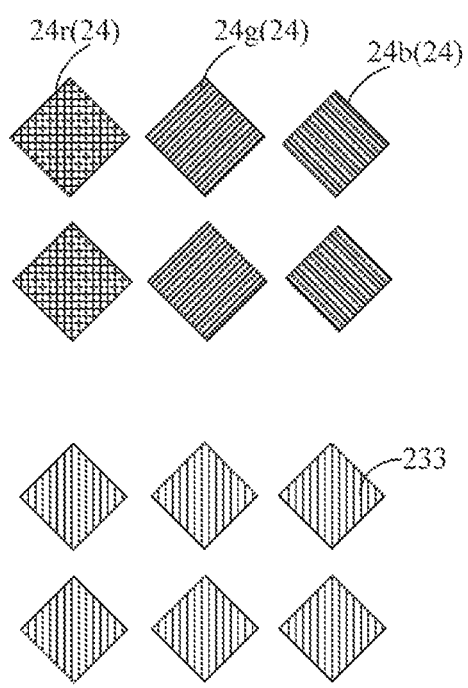
FIG. 7B is a schematic diagram illustrating how to arrange light exiting parts and light-emitting functional layers provided in other embodiments of the present disclosure.

FIG. 7A is a schematic diagram of an arrangement of light exiting parts and light-emitting functional layers provided in some embodiments of the present disclosure, and FIG. 7B is a schematic diagram of an arrangement of light exiting parts and light-emitting functional layers provided in other embodiments of the present disclosure. As shown in FIGS. 7A and 7B, the light exiting parts 24 and the light-emitting functional layers 233 of the light-emitting devices 23 are the same in shape and similar in area; a center of the light exiting part 24 and a center of the light-emitting device 23 may be substantially aligned with each other. In some examples, as shown in FIG. 7A, the light exiting parts 24 and the light-emitting functional layers 233 of the light-emitting devices 23 are arranged in an array, respectively, orthographic projections of the light exiting parts 24 and the light-emitting functional layers 233 on the substrate 10 each are of a rectangle, and two adjacent sides of the rectangle extend in a row direction and a column direction, respectively. In other examples, as shown in FIG. 7B, the light exiting parts 24 and the light-emitting functional layers 233 are arranged in an array, respectively, orthographic projections of the light exiting parts 24 and the light-emitting functional layers 233 on the substrate 10 are each of a diamond, and two diagonal lines of the diamond extend in the row direction and the column direction, respectively.

Alternatively, an area of a minimum cross section of the blue light exiting part 24b is substantially the same as an area of a minimum cross section of the light-emitting functional layer 233 of the light-emitting device 23, and an area of a minimum cross section of the red light exiting part 24r and an area of a minimum cross section of the green light exiting part 24g are greater than or equal to the area of the minimum cross section of the light-emitting functional layer 233. For example, the area of the minimum cross section of the blue light exiting part 24b is equal to the area of the minimum cross section of the light-emitting functional layer 233 of the light-emitting device 23, and a ratio of the area of the minimum cross section of the red light exiting part 24r to the area of the minimum cross section of the light-emitting functional layer 233 and a ratio of the area of the minimum cross section of the green light exiting part 24g to the area of the minimum cross section of the light-emitting functional layer 233 are both in a range of 1 to 1.2. Alternatively, the area of the minimum cross section of the red light exiting part 24r is equal to the area of the minimum cross section of the green light exiting part 24g, and the ratio of the area of the minimum cross section of the red light exiting part 24r to the area of the minimum cross section of the light-emitting functional layer 233 is 1, 1.1 or 1.2, so that more light may be emitted by the red light exiting part 24r and the green light exiting part 24g.

It should be noted that, a cross section of a structure refers to a cross section of the structure in a direction perpendicular to a thickness of the display panel. For example, the light-emitting functional layer 233 is located in a pixel opening of the pixel defining layer, and a top area of the pixel opening is greater than a bottom area, in this case, the minimum cross section of the light-emitting functional layer 233 is a surface of the light-emitting functional layer 233 close to the first electrode 231.

As shown in FIGS. 3A and 3B, the display panel further includes a third encapsulating layer 28, which is arranged on a side of the color conversion layer away from the substrate 10 and encapsulates all the light exiting parts 24.

Since external ambient light also contains blue light, when the blue light in the external ambient light is emitted into the red light exiting part 24r and the green light exiting part 24g, the red light exiting part 24r and the green light exiting part 24g are excited to emit red light and green light, respectively, so that the display effect of the display panel is affected. In order to prevent the display of the display panel from being interfered by the external ambient light, as shown in FIG. 3B, the display panel further includes a color filter layer and a black matrix BM, the color filter layer is located on a side of the color conversion layer away from the substrate 10, the color filter layer includes a plurality of color filter parts 26r, 26g and 26b, each color filter part 26r/26g/26b corresponds to one light exiting part 24, and the color filter parts 26r/26g/26b each have a same color as the light emitted by the corresponding light exiting part 24. For example, the color filter part 26r corresponds to the red light exiting part 24r, and the color filter part 26r is a red color filter; the color filter part 26g corresponds to the green light exiting part 24g, and the color filter part 26g is a green color filter; the color filter part 26b corresponds to the blue light exiting part 24b, and the color filter part 26b is a blue color filter.

As shown in FIG. 3B, the black matrix BM is located on a side of the color conversion layer away from the substrate 10, and is formed as a mesh structure to define the plurality of sub-pixel regions. An orthographic projection of at least a part of each light exiting part 24 on the substrate 10 does not overlap an orthographic projection of the black matrix BM on the substrate 10.

Alternatively, an area of a minimum cross section of each color filter part 26r/26g/26b is substantially equal to an area of the minimum cross section of the corresponding light exiting part 24, so as to prevent external ambient light from interfering with the display of the display panel and prevent crosstalk from occurring between different sub-pixel regions. The term "substantially equal to" means that a ratio of the area of the minimum cross section of the color filter part 26r/26g/26b to the area of the minimum cross section of the corresponding light exiting part 24 is in a range of 0.95 to 1.1.

Figure 8:
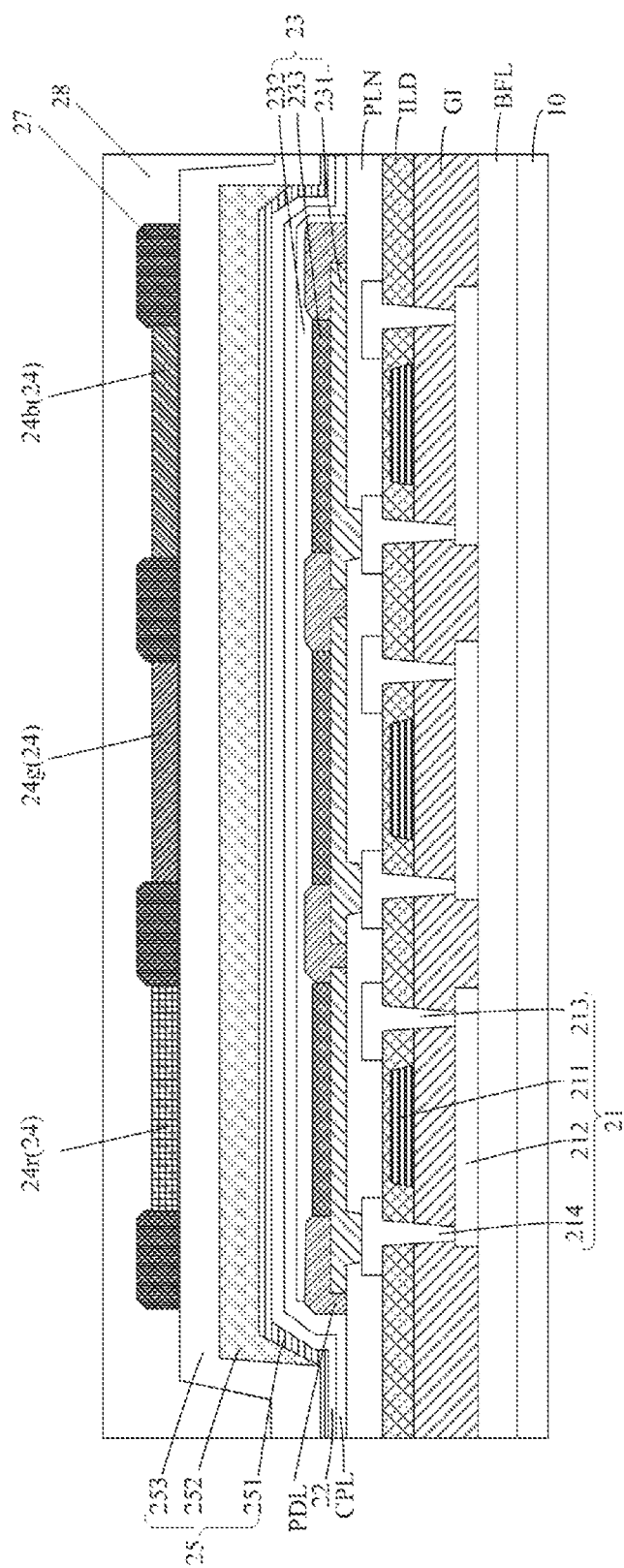
FIG. 8 is a schematic diagram of a display panel provided in one example of the present disclosure.

FIG. 8 is a schematic diagram of a display panel provided in one example of the present disclosure. The display panel shown in FIG. 8 is similar to the display panel shown in FIG. 3A, and the optical layer 253 in FIG. 5 is adopted as the optical layer 253 in both display panels, and includes four first optical sub-layers 2531 and five second optical sub-layers 2532. In FIG. 8, the refractivity of each first optical sub-layer 2531 is set to be 1.45, and a thickness of the film layer is set to be 80 nm; the refractivity of each second optical sub-layer 2532 is set to be 1.85, and a thickness of the film layer is set to be 800 nm. The area of the minimum cross section of each light exiting part 24 is set to be equal to the area of the minimum cross section of the light-emitting functional layer 233. Unlike the display panel shown in FIG. 3A, in the display panel shown in FIG. 8, the second electrodes 232 of the light-emitting devices 23 have a same reflectivity, which is in a range of 50% to 60%, and in this case, the second electrodes 232 of the light-emitting devices 23 may be formed in a one-piece structure.

Figure 9:
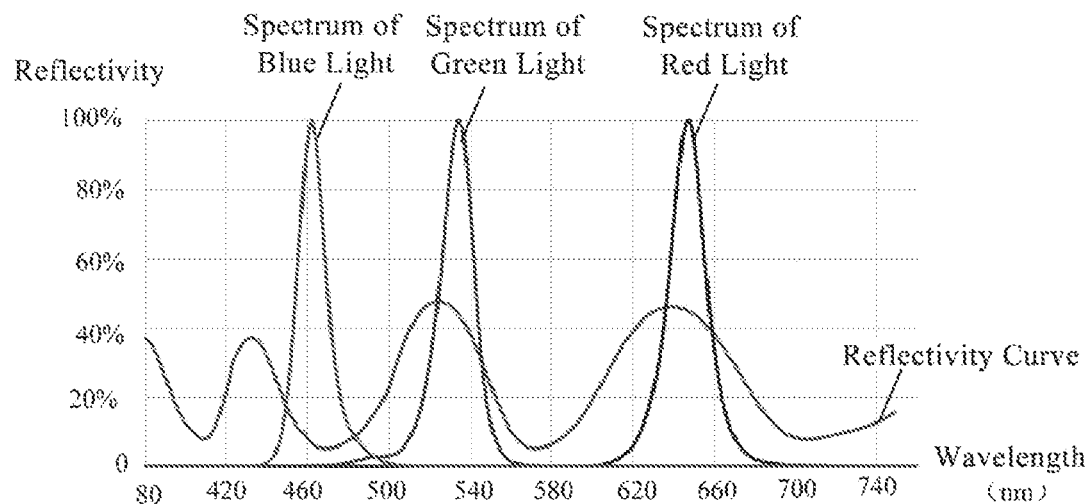
FIG. 9 illustrates spectrum curves of light emitted by the light exiting parts of the display panel in FIG. 8 and a curve of a relationship between reflectivity of the optical layer and a wavelength of the light.

FIG. 9 illustrates spectrum curves of light emitted by the light exiting parts of the display panel in FIG. 8 and a curve of a relationship between the reflectivity of the optical layer and a wavelength of the light. As shown in FIG. 9, the light emitted by the light-emitting device 23 and the blue light exiting part 24b of the display panel is blue light with a wavelength in a range of 435 nm to 500 nm, the light emitted by the red light exiting part 24r is red light with a wavelength in a range of 610 nm to 690 nm, and the light emitted by the green light exiting part 24g is green light with a wavelength in a range of 480 nm to 560 nm. The optical layer 253 has a reflectivity in a range of about 5% to about 20% for the blue light, and has a reflectivity in a range of about 40% to about 45% for the red light emitted by the red light exiting part 24r and a reflectivity in a range of about 40% to about 45% for the green light emitted by the green light exiting part 24g.

Figure 10:
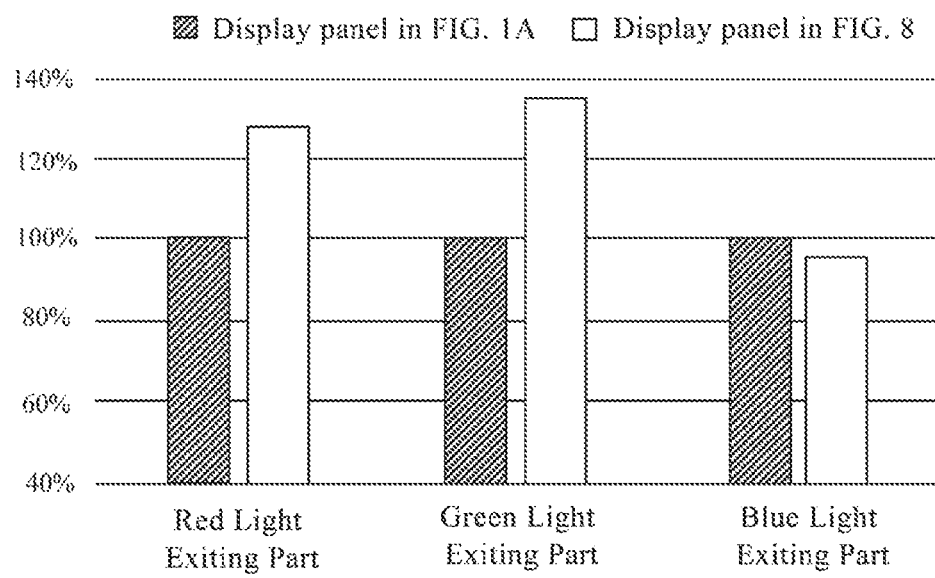
FIG. 10 is a schematic diagram illustrating a comparison between front light extraction efficiencies of the two display panels in FIGS. 1A and 8.

FIG. 10 is a schematic diagram illustrating a comparison between front light extraction efficiencies of the display panels in FIGS. 1A and 8, wherein the display panels in FIGS. 1A and 8 are different in the encapsulation structure 25. The encapsulation structure 25 in FIG. 1A includes a first inorganic encapsulation layer 25a, a second inorganic encapsulation layer 25b and an organic encapsulation layer 25c between the first inorganic encapsulation layer 25a and the second inorganic encapsulation layer 25b. The first inorganic encapsulation layer 25a has a refractivity in a range of 1.70 to 1.75, and a film thickness in a range of 0.8 μm to 1.0 μm; the second inorganic encapsulation layer 25b has a refractivity in a range of 1.80 to 1.95, and a film thickness a range of 0.5 μm to 0.8 μm; the organic encapsulation layer 25c has a refractivity a range of 1.50 to 1.60, and a film thickness a range of 8 μm to 12 μm. The encapsulation structure 25 in FIG. 8 includes a first encapsulation layer 251, a second encapsulation layer 252, and an optical layer 253, wherein a refractivity and a film thickness of the first encapsulation layer 251 may be the same as those of the first inorganic encapsulation layer 25a, and a refractivity and a film thickness of the second encapsulation layer 252 may be the same as those of the organic encapsulation layer 25c; the optical layer 253 includes four first optical sub-layers 2531 and five second optical sub-layers 2532, and a refractivity and a film thickness of the first optical sub-layer 2531 and a refractivity and a film thickness of the second optical sub-layer 2532 are referred to above. As can be seen from FIG. 10, with reference to the light extraction efficiency of a respective light exiting part of the display panel in FIG. 1A, the front light extraction efficiencies of the red light exiting part 24r and the green light exiting part 24g in FIG. 8 are both significantly improved.

Figure 11:
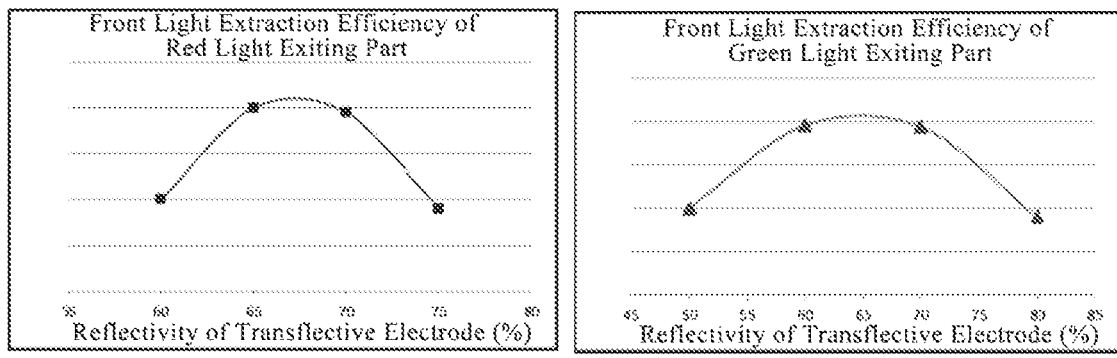
FIG. 11 is a diagraph illustrating a curve of a relationship between the front light extraction efficiency of a respective light exiting part and reflectivity of a second electrode in FIG. 3A.
Figure 12:
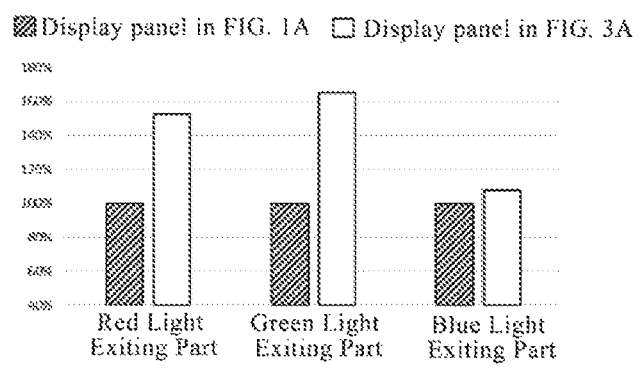
FIG. 12 is a schematic diagram illustrating a comparison between front light extraction efficiencies of the two display panels in FIGS. 1A and 3A.

FIG. 11 is a diagraph illustrating a curve of a relationship between the front light extraction efficiency of a respective light exiting part and reflectivity of a second electrode in FIG. 3A, wherein the curve of FIG. 11 is obtained based on the following parameters, the optical layer 253 has the structure shown in FIG. 5, and includes four first optical sub-layers 2531 and five second optical sub-layers 2532, wherein the refractivity of each first optical sub-layer 2531 is set to be 1.45, and the thickness of the film layer is set to be 80 nm; the refractivity of each second optical sub-layer 2532 is set to be 1.85, and the thickness of the film layer is set to be 800 nm; the area of the minimum cross section of each light exiting part 24 is equal to the area of the minimum cross section of the light-emitting functional layer 233. As shown in FIG. 11, when the reflectivity of the second electrode 232 corresponding to the red light exiting part 24r is in a range of 65% to 70%, the front light extraction efficiency of the red light exiting part 24r reaches a maximum value; when the reflectivity of the second electrode 232 corresponding to the green light exiting part 24g is in a range of 60% to 70%, the front light extraction efficiency of the green light exiting part 24g reaches a maximum value; and when the reflectivity of the second electrode 232 corresponding to the blue light exiting part 24b is in a range of 50% to 60%, and the front light extraction efficiency of the blue light exiting part 24b reaches a maximum value. FIG. 12 is a schematic diagram illustrating a comparison between the front light extraction efficiencies of the two display panels in FIGS. 1A and 3A. It can be seen from FIG. 12 that the front light extraction efficiencies of the red light exiting part 24r, the green light exiting part 24g and the blue light exiting part 24b in FIG. 3A are all obviously improved with respect to the front light extraction efficiencies of the respective light exiting parts of the display panel in FIG. 1A.

In addition, the display panels in FIGS. 3A and 3B are described by taking an On-EL structure (i.e., the color conversion layer is directly formed on the encapsulation structure 25 of the light-emitting devices 23) as an example, but the structure of the display panel in the present disclosure is not limited thereto. For example, the display panel may alternatively adopt a cell structure, that is, the display panel includes a display substrate and a color filter substrate that are opposite to each other, the display substrate includes a light-emitting device and an encapsulation structure for the light-emitting device on a substrate, and the color filter substrate includes a cover plate and a color conversion layer on the cover plate, the color conversion layer is arranged on a side of the cover plate close to the display substrate. The color filter substrate and the display substrate may be connected with each other by adopting a supporting structure and/or a filling layer. Where the display panel adopts the cell structure, the optical layer may be arranged on the display substrate as the On-EL structure, or may be arranged on the color filter substrate. Where the optical layer is arranged on the color filter substrate, for example, an encapsulation layer of the color conversion layer is further arranged on the cover plate, and the optical layer is arranged on a side of the encapsulation layer away from the cover plate, for another example, the optical layer serves as the encapsulation layer for the color conversion layer and is arranged on a side of the color conversion layer away from the cover plate.

It should be noted that the ranges of the refractivity, the reflectivity, the thickness and the ratio of areas of the respective layer in the embodiments of the present disclosure all include endpoints.

An embodiment of the present disclosure further provides a display apparatus, which includes the display panel in the above described embodiment. The display apparatus may be any product or component with a display function, such as a mobile phone, a tablet computer, a television, a monitor, a notebook computer, a digital photo frame, a navigator or the like.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications are to be considered within the protection scope of the present disclosure.

What is claimed is:

1. A display panel, comprising:
   a plurality of light-emitting devices on a substrate, wherein each of the plurality of light-emitting devices is configured to emit light of a preset color; the light-emitting device includes a first electrode, a second electrode and a light-emitting functional layer, the first electrode and the second electrode are opposite to each other, the light-emitting functional layer is between the second electrode and the first electrode, and the first electrode is a reflective electrode;
   a color conversion layer comprising a plurality of light exiting parts, wherein each of the plurality of light exiting part corresponds to one of the plurality of light-emitting devices, the light exiting part is on a side of the second electrode away from the light-emitting functional layer, and the light exiting part is configured to receive the light emitted by the corresponding light-emitting device and emit light of a color same as or different from the preset color; and
   an optical layer between the color conversion layer and the plurality of light-emitting devices, wherein the optical layer is configured to transmit at least a portion of the light of the preset color and reflect the light of a color different from the preset color emitted by the color conversion layer;
   wherein the second electrodes corresponding to at least two light exiting parts, which emit light of different colors, have different reflectivities,
   wherein the optical layer comprises a plurality of first optical sub-layers and a plurality of second optical sub-layers, which are alternately stacked, and a refractivity of each of the plurality of first optical sub-layers is less than a refractivity of each of the plurality of second optical sub- layers,
   wherein the display panel further comprises:
   a first encapsulation layer between the plurality of light-emitting devices and the optical layer; and
   a second encapsulation layer between the first encapsulation layer and the optical layer;

wherein the first encapsulation layer is made of an inorganic material, and the second encapsulation layer is made of an organic material; the optical layer is directly adjacent to the second encapsulation layer, an orthographic projection of each of the plurality of first optical sub-layers and the plurality of second optical sub-layers on the substrate covers an orthographic projection of the plurality of light-emitting devices on the substrate, and the first encapsulation layer, the second encapsulation layer and the optical layer form an encapsulation structure to encapsulate the plurality of light-emitting devices.

2. The display panel according to claim 1, wherein the plurality of light exiting parts of the color conversion layer comprise a red light exiting part for emitting red light, a green light exiting part for emitting green light and a blue light exiting part for emitting blue light; and
a reflectivity of the second electrode corresponding to the red light exiting part and a reflectivity of the second electrode corresponding to the green light exiting part are both greater than a reflectivity of the second electrode corresponding to the blue light exiting part.

3. The display panel according to claim 2, wherein the reflectivity of the second electrode corresponding to the red light exiting part is greater than the reflectivity of the second electrode corresponding to the green light exiting part.

4. The display panel according to claim 2, wherein the reflectivity of the second electrode corresponding to the red light exiting part is in a range of 65% to 70%;
the reflectivity of the second electrode corresponding to the green light exiting part is in a range of 60% to 70%; and
the reflectivity of the second electrode corresponding to the blue light exiting part is in a range of 50% to 60%.

5. The display panel according to claim 4, wherein a material of the second electrode of each of the plurality of light-emitting devices comprises silver and magnesium, a thickness of the second electrode corresponding to the red light exiting part is in a range of 15 nm to 20 nm, a thickness of the second electrode corresponding to the green light exiting part is in a range of 12 nm to 20 nm, and a thickness of the second electrode corresponding to the blue light exiting part is in a range of 10 nm to 15 nm.

6. The display panel according to claim 1, wherein the preset color is blue.

7. The display panel according to claim 1, wherein the refractivity of the first optical sub-layer is in a range of 1.45 to 1.50, and the refractivity of the second optical sub-layer is in a range of 1.85 to 1.95.

8. The display panel according to claim 7, wherein a material of the first optical sub-layer comprises an oxide of silicon, and a material of the second optical sub-layer comprising a nitride of silicon.

9. The display panel according to claim 1, wherein the first optical sub-layer has a thickness in a range of 80 nm to 100 nm, and the second optical sub-layer has a thickness in a range of 700 nm to 800 nm.

10. The display panel according to claim 1, wherein among the plurality of first optical sub-layers and the plurality of second optical sub-layers of the optical layer, one of the plurality of second optical sub-layers is closest to the color conversion layer.

11. The display panel according to claim 1, wherein the optical layer comprises at least four of the first optical sub-layers and at least five of the second optical sub-layers.

12. The display panel according to claim 1, wherein the second encapsulation layer is in contact with one of the plurality of second optical sub-layers of the optical layer, and a refractivity of the second encapsulation layer is less than a refractivity of the second optical sub-layer in contact with the second encapsulation layer.

13. The display panel according to claim 1, further comprising:
a light extraction layer between the second electrode of each of the plurality of light-emitting devices and the first encapsulation layer, and in contact with the second electrode; wherein the light extraction layer is configured to transmit the light emitted by the light-emitting device; and
a protective layer between the first encapsulation layer and the light extraction layer.

14. The display panel according to claim 1, wherein a material of at least a part of the plurality of light exiting parts comprises a quantum dot material, and the display panel further comprises a third encapsulation layer, which is on a side of the color conversion layer away from the optical layer.

15. The display panel according to claim 1, further comprising:
an accommodating structure layer on a side of the optical layer away from the light-emitting device, wherein the accommodating structure layer has a plurality of accommodating grooves, and the plurality of light exiting parts are arranged in the plurality of accommodating grooves in a one-to-one correspondence manner.

16. The display panel according to claim 1, further comprising:
a color filter layer on a side of the color conversion layer away from the optical layer, wherein the color filter layer comprises a plurality of color filter parts, the plurality of color filter parts are in a one-to-one correspondence with the plurality of light exiting parts, and a color of each of the plurality of color filter parts is the same as the color of the light emitted by the corresponding light exiting part; and
a black matrix on a side of the color conversion layer away from the light-emitting device, wherein an orthographic projection of at least a part of each of the plurality of light exiting parts on the substrate does not overlap an orthographic projection of the black matrix on the substrate.

17. The display panel according to claim 16, wherein the plurality of light exiting parts comprise a red light exiting part for emitting red light, a green light exiting part for emitting green light and a blue light exiting part for emitting blue light; and
a ratio of an area of a minimum cross section of the red light exiting part to an area of a minimum cross section of the blue light exiting part and a ratio of an area of a minimum cross section of the green light exiting part to an area of a minimum cross section of the blue light exiting part are both in a range of 1:1 to 1.2:1.

18. A display apparatus, comprising the display panel according to claim 1.

* * * * *